(12) United States Patent
Oi et al.

(10) Patent No.: US 7,375,022 B2
(45) Date of Patent: May 20, 2008

(54) METHOD OF MANUFACTURING WIRING BOARD

(75) Inventors: Kiyoshi Oi, Nagano (JP); Noriyoshi Shimizu, Nagano (JP); Tomoo Yamasaki, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 228 days.

(21) Appl. No.: 11/317,403

(22) Filed: Dec. 23, 2005

(65) Prior Publication Data

US 2006/0141764 A1    Jun. 29, 2006

(30) Foreign Application Priority Data

Dec. 28, 2004   (JP) ............................. 2004-380555

(51) Int. Cl.
*H01L 21/4763* (2006.01)
(52) U.S. Cl. ................ 438/622; 438/625; 257/532; 257/528; 257/700; 257/300; 257/E21.703; 257/E23.062; 174/260
(58) Field of Classification Search ............... 438/622, 438/106, 381, 625; 257/777, 758, 532, 528, 257/E23.062, E23.063, E23.067, E23.071, 257/300, 700; 174/260
See application file for complete search history.

(56) References Cited

U.S. PATENT DOCUMENTS

| 6,849,951 | B1* | 2/2005 | Trimberger et al. ........ 257/777 |
|---|---|---|---|
| 2001/0040272 | A1* | 11/2001 | Mashino ...................... 257/532 |
| 2002/0182804 | A1* | 12/2002 | Echigo et al. ............... 438/250 |
| 2004/0056344 | A1* | 3/2004 | Ogawa et al. ............... 257/686 |
| 2004/0164337 | A1* | 8/2004 | Yamasaki et al. ........... 257/300 |
| 2004/0180540 | A1* | 9/2004 | Yamasaki et al. ........... 438/667 |
| 2006/0118907 | A1* | 6/2006 | Park ........................... 257/532 |

FOREIGN PATENT DOCUMENTS

| JP | 2003 264253 | 9/2003 |
|---|---|---|
| JP | 2004 14573 | 1/2004 |
| JP | 2004 152883 | 5/2004 |
| JP | 2004 281830 | 10/2004 |

* cited by examiner

*Primary Examiner*—Brook Kebede
*Assistant Examiner*—Shaka Scarlett
(74) *Attorney, Agent, or Firm*—Ladas & Parry LLP

(57) ABSTRACT

A method of manufacturing a wiring board is disclosed. The wiring board has: a capacitor, having multiple electrode layers which oppose each other with a dielectric layer in between, that is connected to a semiconductor chip; one or more via wirings which pierce the electrode layers and which are connected to the semiconductor chip, and pattern wirings connected to the via wirings. The method includes: forming the electrode layers, each having one or more through holes which the via wirings pierce, and the dielectric layer, and forming the capacitor; installing the capacitor such that the capacitor opposes the pattern wirings over an insulating layer; forming one or more via holes which reach the pattern wirings from the through holes; and forming the via wiring in the via hole.

10 Claims, 17 Drawing Sheets

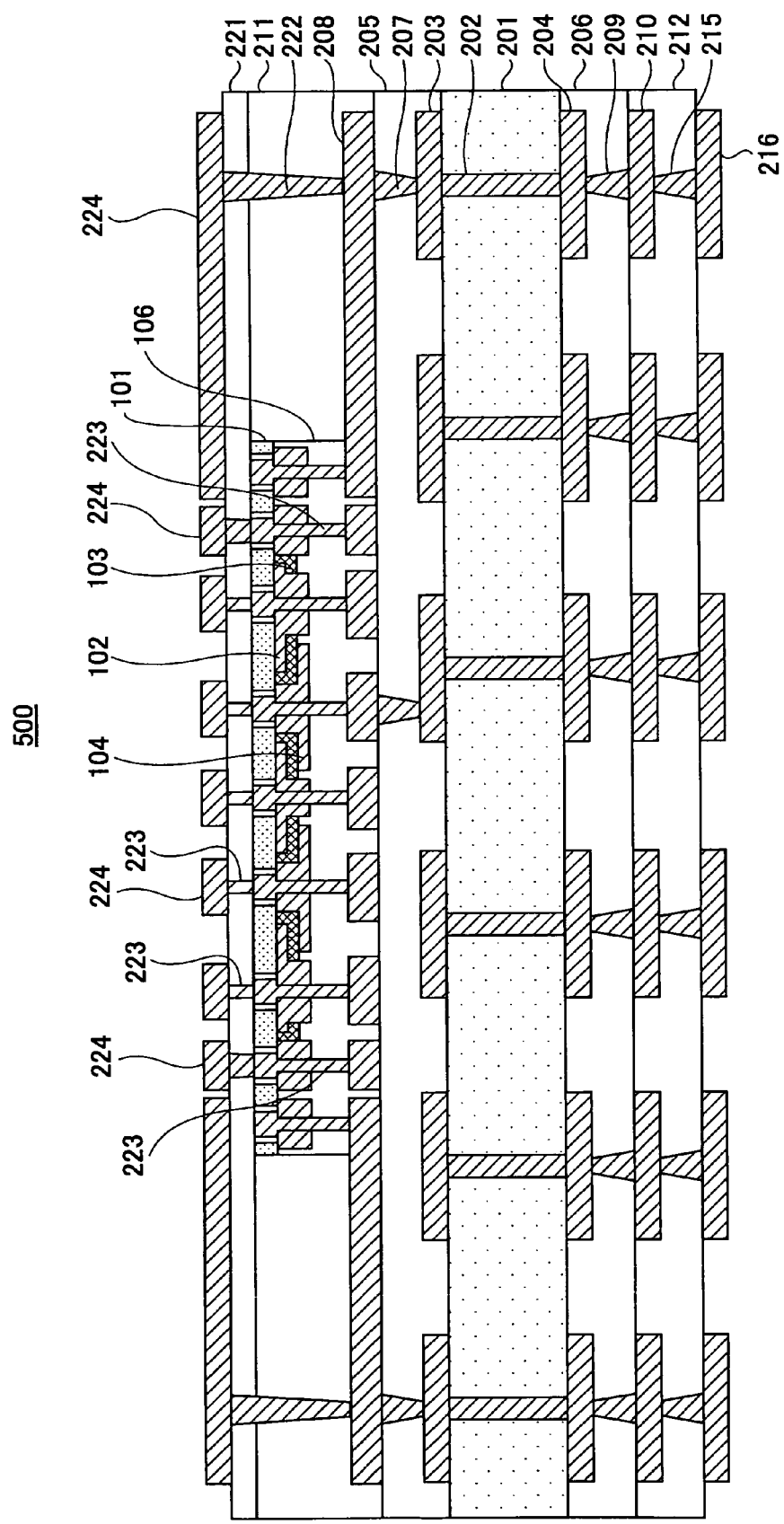

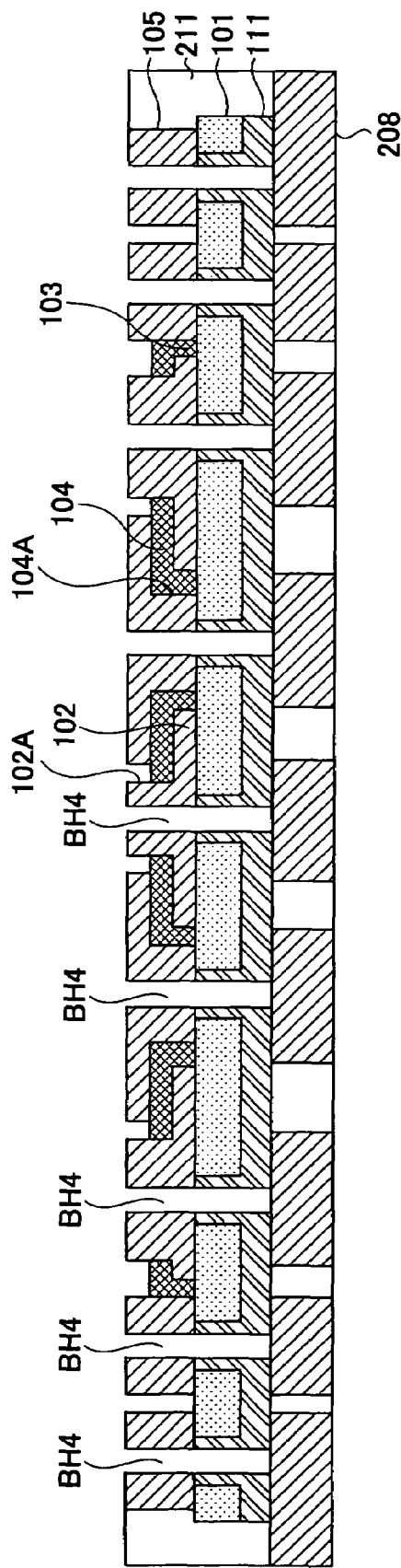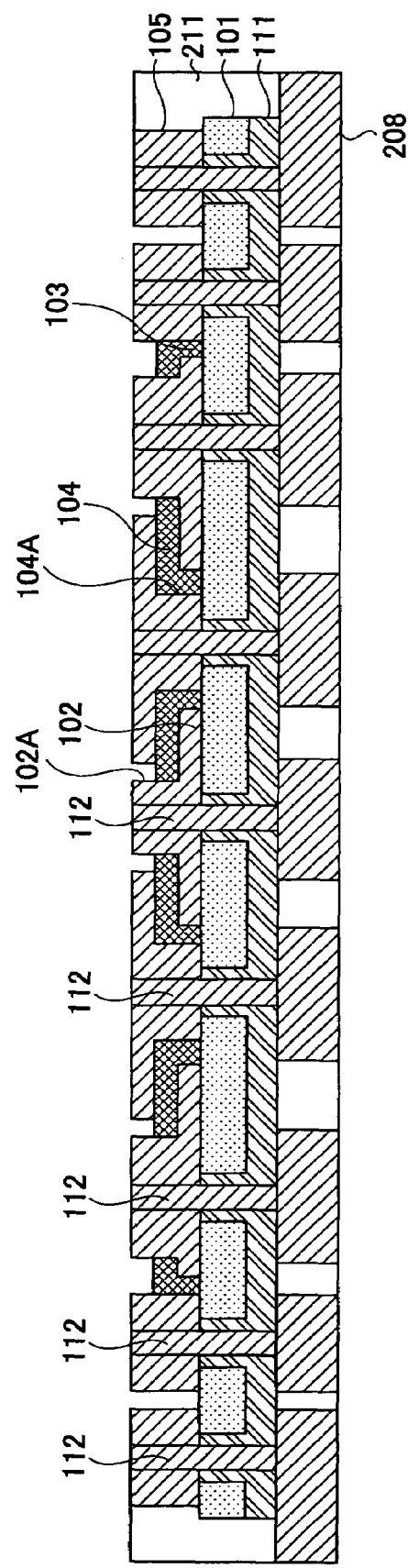

METHOD OF MANUFACTURING WIRING BOARD

BACKGROUND OF THE INVENTION

1. Field of the Invention

The present invention generally relates to a wiring board, and particularly relates to a method of manufacturing a wiring board having a decoupling capacitor which is connected to a semiconductor chip.

2. Description of the Related Art

In recent years, with a semiconductor device such as a semiconductor chip becoming smaller and thinner, there has been a need to make a decoupling capacitor (which may also be called a bypass capacitor) smaller for suppressing changes in the power supply voltage of the semiconductor chip so as to stabilize its operation, and to use thin-film technologies for the decoupling capacitor.

Moreover, as the operating frequency of the semiconductor chip is expected to become higher in order to further increase the operating speed of the semiconductor chip in the future, the decoupling capacitor is preferably installed in the vicinity of the semiconductor chip in order to reduce the inductance of the decoupling capacitor connection.

Thus, different decoupling capacitors and methods of installing the decoupling capacitors that respond to the need as described above are being proposed.

For example, when a semiconductor chip is mounted on a wiring board so as to use the semiconductor chip, a method of mounting a decoupling capacitor on the back side of a wiring board, or in other words, on the side opposite the side on which the semiconductor chip is mounted (for example, refer to Patent Document 1), and structures and forms for embedding the decoupling capacitor into the wiring board are being proposed (for example, refer to Patent Documents 2 through 4).

Patent Document 1
JP2003-264253A
Patent Document 2
JP2004-14573A
Patent Document 3
JP2004-152883A
Patent Document 4
JP2004-281830A However, for installing a decoupling capacitor in a wiring board on which a semiconductor chip is mounted, a problem could arise with the reliability of the wiring structure to which the decoupling capacitor and the semiconductor chip are connected.

For example, when trying to simply configure the wiring structure to which a decoupling capacitor and a semiconductor are connected, it is preferable that via wiring be formed such that it pierces the decoupling capacitor, thereby simplifying the wiring structure and making it possible to reduce the impedance of the wiring structure.

However, as the via wiring and pattern wiring connected to the via wiring are minituarized, problems could arise with the registration tolerance (the alignment tolerance) of the via wiring, or with the reliability of the connection between the via wiring and electrode layers of the decoupling capacitor, or with the reliability of the connection between the via wiring and the pattern wiring, possibly making it difficult to make a low-impedance structure which is superior in the reliability of the connection.

SUMMARY OF THE INVENTION

The present invention may provide a wiring board which substantially obviates one or more problems caused by the limitations and disadvantages of the related art.

In light of the problems as described above, in a particular embodiment of the present invention is provided a method of manufacturing a wiring board that makes it possible to make the reliability of the connection of a decoupling capacitor mounted on the wiring board superior.

According to an embodiment of the invention, a wiring board includes a capacitor with multiple electrode layers which oppose each other with a dielectric layer in between, that is connected to a semiconductor chip; one or more via wirings which pierce the electrode layers and which are connected to the semiconductor chip, and pattern wirings connected to the via wirings. A method of manufacturing the wiring board includes: forming the electrode layers, each having one or more through holes which the via wirings pierce, and the dielectric layer, thus forming the capacitor; installing the capacitor such that the capacitor opposes the pattern wiring over an insulating layer; forming one or more via holes which reach the pattern wiring from the through holes; and forming the via wirings in the via holes.

The wiring board in an embodiment of the invention makes it possible to make the reliability of the connection of the decoupling capacitor superior.

Other objects and further features of the present invention will become apparent from the following detailed description when read in conjunction with the accompanying drawings.

BRIEF DESCRIPTION OF THE DRAWINGS

FIG. 8 is a diagram illustrating a third example of the wiring board which is formed by the method of manufacturing according to the embodiment 1;

FIG. 9E is a fifth diagram illustrating a method of manufacturing the wiring board according to the embodiment 2; and FIG. 9F is a sixth diagram illustrating a method of manufacturing the wiring board according to the embodiment 2.

DETAILED DESCRIPTION OF THE PREFERRED EMBODIMENTS

Figure 1A:
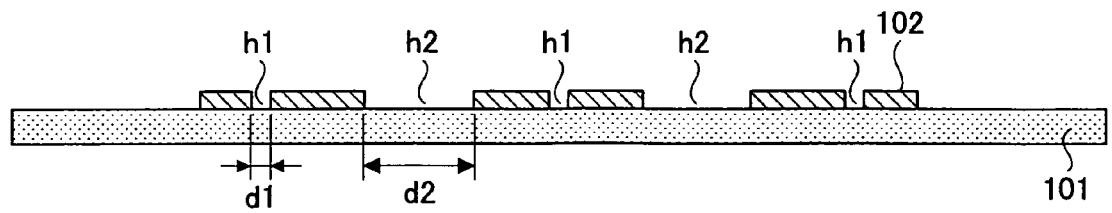
FIG. 1A is a first diagram illustrating a method of forming a capacitor according to an embodiment 1.
Figure 1B:
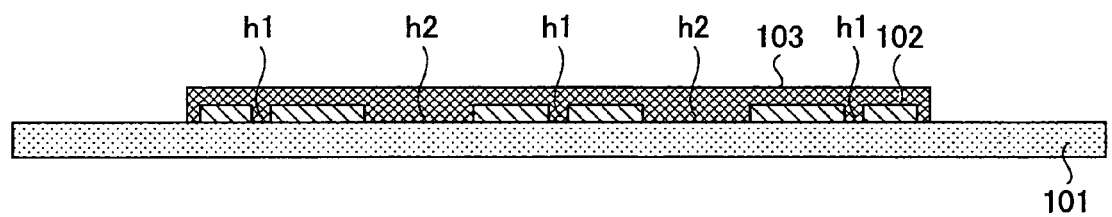
FIG. 1B is a second diagram illustrating the method of forming the capacitor according to the embodiment 1.
Figure 1C:
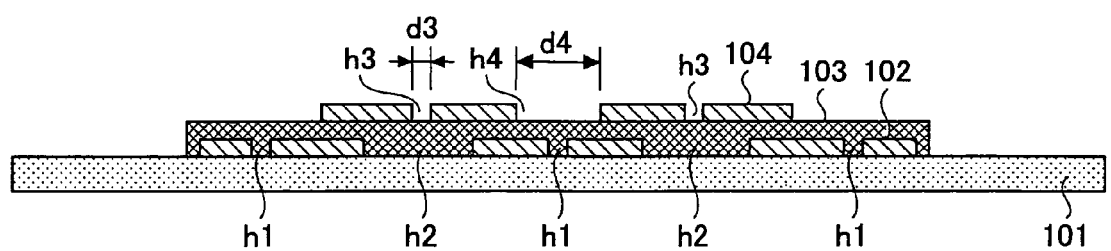
FIG. 1C is a third diagram illustrating the method of forming the capacitor according to the embodiment 1.

Embodiments of the present invention are described below.

Embodiment 1

In the present embodiment, a method is described of manufacturing a wiring board to which a semiconductor chip is connected, in which wiring board is installed a decoupling capacitor (below described as the capacitor) for stabilizing the power supply voltage of the semiconductor chip.

In the method of manufacturing the wiring board according to the present embodiment, it is possible to simplify the wiring structure to which the capacitor and the semiconductor chip are connected. In the wiring board manufactured using the present embodiment, it is possible to reduce the impedance pertaining to the connection of the semiconductor chip and the capacitor so as to reduce noise of the power supply line and stabilize the power supply voltage.

In this way, with the wiring board according to the present embodiment, the capacitor and the semiconductor chip are connected using via wiring which pierces the capacitor in order to simplify the structure to which the capacitor and the semiconductor chip are connected.

However, as the via wiring and pattern wiring of the wiring board to which the via wiring is connected are minituarized, problems could arise with the registration tolerance (the alignment tolerance) of the via wiring, or with the reliability of the connection between the via wiring and electrode layers of the capacitor, or with the reliability of the connection between the via wiring and the pattern wiring.

Thus, the method of manufacturing the wiring board according to the present embodiment has a feature of making the registration tolerance superior when forming a via hole for forming the via wiring which pierces the capacitor.

In the method of manufacturing of the present embodiment, the process as described below is followed when, for instance, the pattern wiring and the via wiring which pierces the capacitor are connected.

First the capacitor is installed on the pattern wiring via an insulating layer, and the electrode layers of the capacitor are a so-called conformal mask so that a via hole which reaches the pattern wiring is formed in the insulating layer.

Thus, the registration tolerance (the alignment tolerance) for forming the via hole is made superior, and, for example, the reliability of the connection between the electrode layers and the via wiring, or the reliability of the connection between the via wiring and the pattern wiring is made superior.

Specific examples of the present embodiment are described below based on the drawings.

First a method of forming a capacitor is described based on FIGS. 1A through 1D and FIG. 2, and then a wiring board in which the capacitor is installed and a method of manufacturing the wiring board are described based on FIG. 3, FIGS. 4A through 4C, and FIGS. 5A through 5E. It is noted that, in the drawings, for a part previously described the same reference letter is given to a subsequent occurrence of the part so that duplicate explanations may be omitted.

First, in the process illustrated in FIG. 1A, a first electrode layer 102 of a capacitor is formed with, for example, copper plating, on a core substrate 101 consisting of, for example, silicon, glass, or a metal material. Here, when the core substrate 101 consists of silicon or a metal material, etc., an insulating film such as an oxide film is formed on the core substrate surface prior to forming the first electrode layer 102. In the first electrode layer 102 is formed a first through hole h1 with the diameter d1 and a through hole h2 with the diameter d2 which is larger than the diameter d1 for via wirings to pierce in the subsequent process. Here, the first electrode layer 102 can be formed with a method of etching a pattern after forming a copper plating uniformly on the core substrate, or with a pattern plating process such as a semi-additive process.

Next, a dielectric layer 103 is formed on the first electrode layer 102. Here, the dielectric layer 103 consists of, for example, a Ta anodic oxide film (a $Ta_2O_5$ film). As a condition for anodic oxidation the formation voltage is 200 V, for example, and an aqueous citric acid solution is used for the anodic oxidation. Moreover, the dielectric layer is not limited to the $Ta_2O_5$ film, and using a so-called ferroelectric film makes it possible to increase the capacitance of the capacitor. For example, a film consisting of STO (strontium titanate), BST (barium strontium titanate), or PST (lead zirconium titanate) can be used. Moreover, these films can be formed with various methods, for example, CVD (chemical vapor deposition) method.

Next, a second electrode layer 104 is formed with, for example, copper plating, on the dielectric layer 103 such that the first electrode layer 102 and the second electrode layer 104 oppose each other with the dielectric layer 103 in between. Here, in the second electrode layer 104 is formed a through hole h3 with the diameter d3 and a through hole h4 with the diameter d4 which is larger than the diameter d3 for via wirings to pierce in the subsequent process. Here, the second electrode layer 104 can be formed with the pattern etching process after uniformly forming the copper plating, or with the pattern plating process such as the semi-additive process.

Preferably, the respective through holes are formed such that the through hole h1 opposes the through hole h4, the through hole h2 opposes the through hole h3, and in the subsequent process via wirings pierce the through holes h1 and h4 and the through holes h2 and h3. Here, the via wiring which pierces the through holes h1 and h4 is formed such that it is connected to the first electrode layer 102 at the through hole h1, while the via wiring which pierces the through holes h2 and h3 is formed such that it is connected to the second electrode layer 104 at the through hole h3.

These via wirings are connected to the power supply line and the ground line, respectively, of the semiconductor chip. In other words, each of the first electrode layer and the second electrode layer of the capacitor is connected to a via wiring, and the capacitor is inserted between the power supply line and the ground line.

Figure 1D:
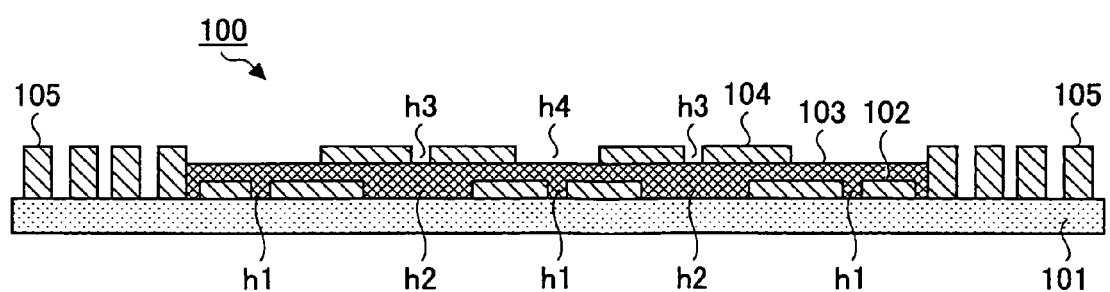
FIG. 1D is a fourth diagram illustrating the method of forming the capacitor according to the embodiment 1.

Here, the via hole for forming the via wiring is formed with the first electrode layer 102 or the second electrode layer 104 as a mask. Details of the process are described below in the subsequent process. Moreover, as illustrated in FIG. 1D, a mask pattern 105 may be formed with, for example, copper plating, on the core substrate 101. The mask pattern 105 is used as a mask for forming a via wiring connected to a line, such as a signal line, for example, that is not required to be connected to the capacitor.

Figure 2:
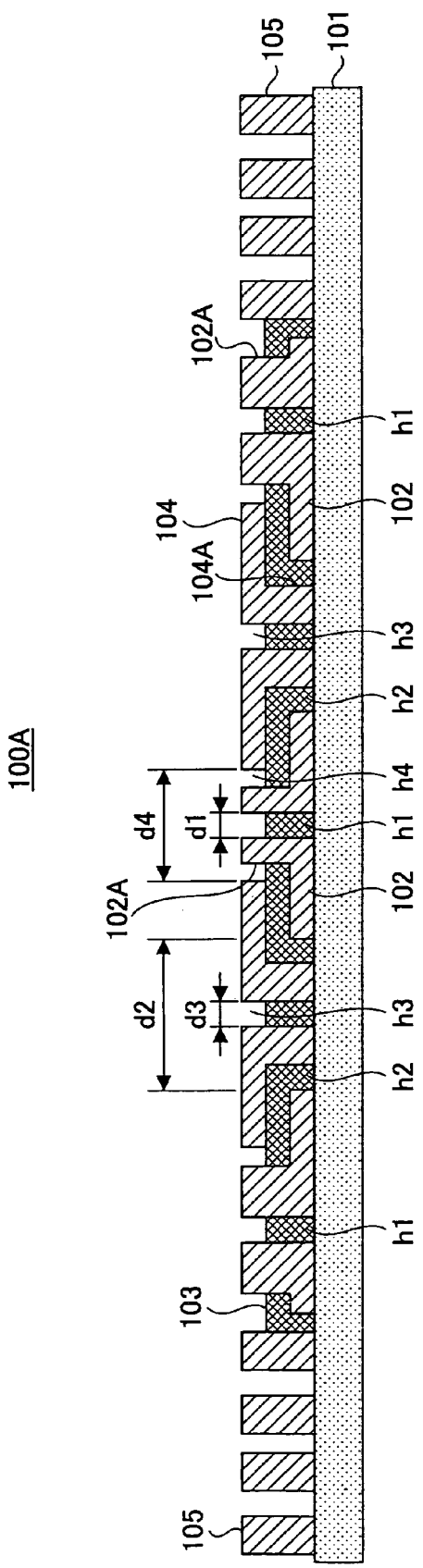
FIG. 2 is a variant of the capacitor illustrated in FIG. 1D.

While the process as described above is an example of forming a capacitor, connected to a semiconductor chip, that has the electrode layers opposing each other with the dielectric layer in between, the capacitor 100 may be varied as a capacitor 100A as next illustrated in FIG. 2.

In the capacitor 100A a generally-cylindrical via contact portion 102A, consisting of, for example, copper plating, is formed at the first electrode layer 102. The via contact portion 102A is formed in a generally cylindrical shape in the direction from the first electrode layer to the second electrode layer. Moreover, the via contact portion 102A is formed such that its inner space communicatively connects to the through hole h1 or forms a part of the through hole h1, and a via wiring is formed in the inner space as described above in the subsequent process. Here, with the via wiring being formed such that it is in contact with the inner wall face of the through hole h1 and such that it is in contact with the inner wall face of the via contact portion 102A, the area of contact between the via wiring and the first electrode layer increases, making it possible to reduce the impedance of the connection of the via wiring and the electrode layer.

Moreover, the via contact portion 102A is formed of a conductor such as copper, etc., so that it can be used as a seed layer (an electrode) for electrolytic plating when forming via wiring in the subsequent process. For example, when the via contact portion 102A is not formed, a need arises to apply copper plating to the dielectric layer for forming via wiring after forming a via hole. In this case, it is difficult to form the seed layer on the dielectric layer with non-electrolytic copper plating, and it is necessary to adopt a time- and cost-consuming method such as, for example, CVD or sputtering, in order to form the seed layer. Here, with the via contact portion formed as illustrated in FIG. 2, it is possible to more easily form via wiring with electrolytic plating when it pierces the through hole and inside the via contact portion. In other words, the via contact portion is formed so as to protect the surface of the dielectric layer, so that it is easy to apply plating of, for example, copper.

Furthermore, at the second electrode layer 104 is formed a generally-cylindrical via contact portion 104A consisting of, for example, copper. The via contact portion 104A is formed in a generally cylindrical shape in the direction from the second electrode layer to the first electrode layer. In addition, the via contact portion 104A is formed such that its inner space communicatively connects to the through hole h3 or forms a part of the through hole h3, and via wiring is formed in the subsequent process in the inner space as described above. Here, with the via wiring being formed such that it is in contact with the inner wall face of the through hole h3 and such that it is contact with the inner wall of the via contact portion 104A, the area of contact between the via wiring and the second electrode layer increases, making it possible to reduce the impedance of the connection of the via wiring and the electrode layer.

In this case, for forming the via wiring with plating, the via contact portion 104A provides the same advantage as the via contact portion 102A.

Figure 3:
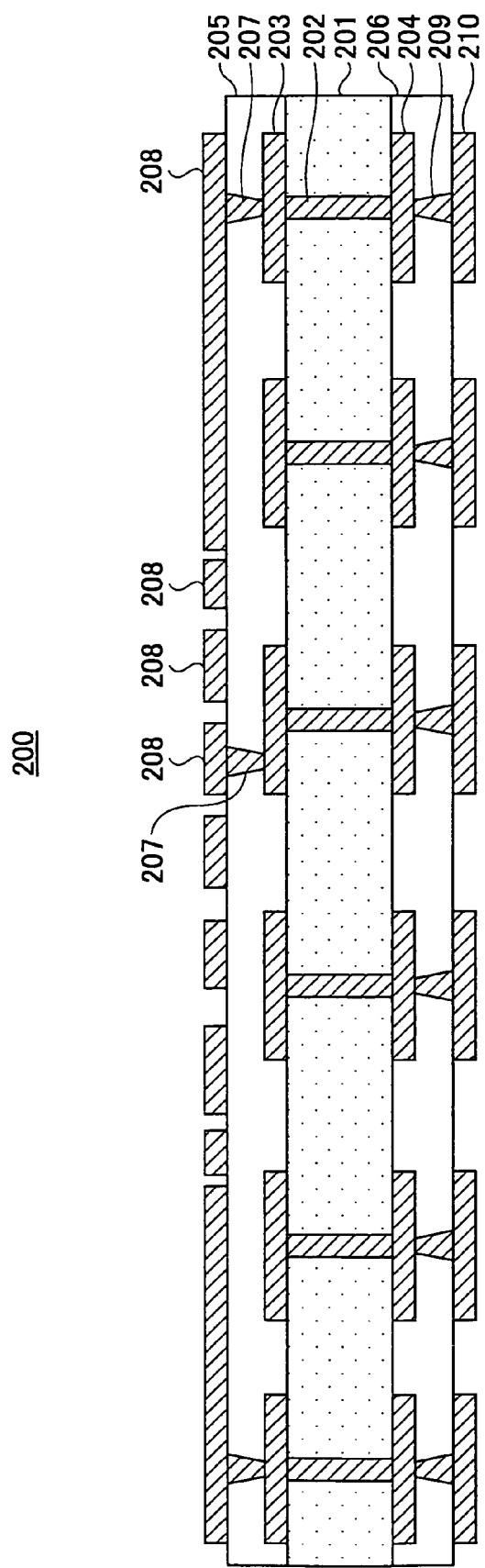
FIG. 3 is an example of a multilayer wiring structure in which a capacitor is installed.

A cross-sectional view of a multilayer wiring board 200, which is one example in which the capacitor 100 or the capacitor 100A is installed so that a wiring board is configured, is schematically illustrated in FIG. 3.

Referring to FIG. 3, the multilayer wiring board 200 has, for example, a core substrate 201, via wirings 202 consisting of, for example, copper, that are formed such that they pierce the core substrate 201, and pattern wirings 203 and pattern wirings 204 consisting of, for example, copper, that are connected to the via wirings 202 and are formed on opposite sides of the core substrate such that, for example, they oppose each other.

On a first side (on which the capacitor is formed in the subsequent process) of the core substrate is formed an insulating layer 205 consisting of resin such as, for example, epoxy, that covers the pattern wirings 203 formed on the first side; on the insulating layer 205 are formed pattern wirings 208 consisting of, for example, copper, and the pattern wirings 203 and the pattern wirings 208 are connected at arbitrary locations with via wirings 207 consisting of, for example, copper, that are formed in the insulating layer 205.

On the other hand, on a second side opposite the first side of the core substrate is formed an insulating layer 206 consisting of resin such as, for example, epoxy, such that it covers the pattern wirings 204 formed on the second side; on the insulating layer 206 are formed pattern wirings 210 consisting of, for example, copper, and the pattern wirings 210 and the pattern wirings 204 are connected with via wirings 209 consisting of, for example, copper, that are formed in the insulating layer 206.

In the multilayer wiring board 200 is formed a wiring board to which a semiconductor chip is connected, in which wiring board is installed the capacitor 100 as illustrated in FIG. 1D or the capacitor 100A as illustrated in FIG. 2, on which wiring board is further formed as needed multilayer wiring.

A method of installing the capacitor 100 or the capacitor 100A in the multilayer wiring board 200 and manufacturing a wiring board is described according to the processes, using FIGS. 4A through 4C, and FIGS. 5A through 5E. Moreover, for the method of manufacturing according to the present embodiment, while either one of the capacitor 100 and the capacitor 100A may be used, a case of using the capacitor 100A is described below as an example.

Figure 4A:
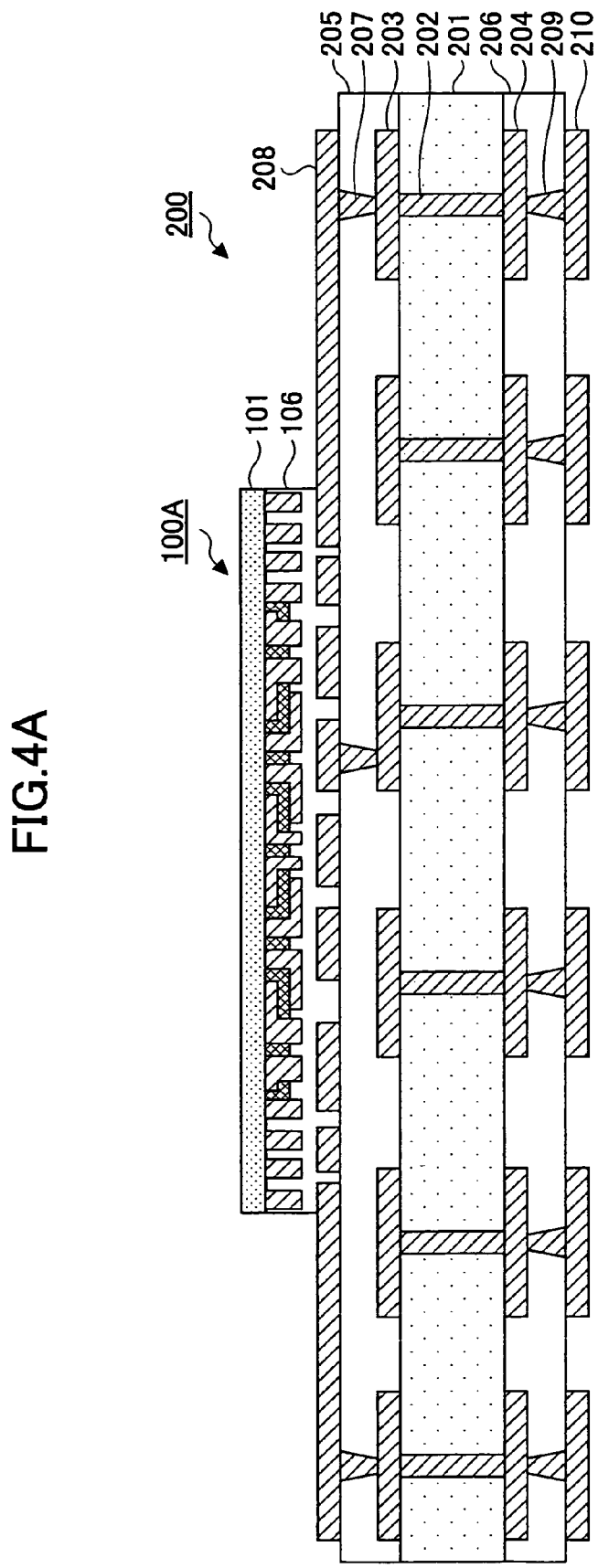
FIG. 4A is a first diagram illustrating a method of manufacturing a wiring board according to the embodiment 1.

Now, in the process as illustrated in FIG. 4A, an insulating layer 106 consisting of resin material such as, for example, epoxy, is formed by applying or laminating such that it covers the electrode layers and the dielectric layer of the capacitor 100A, which insulating layer 106 is installed such that it is in contact with the pattern wirings 208, in other words, the capacitor is installed such that it opposes the pattern wirings 208 with the insulating layer 106 in between.

Here, it is preferable that the insulating layer 106 be installed such that its resin is incompletely hardened, and subsequently the resin is heated so as to cause the hardening to proceed, so that the insulating layer 106 functions as an adhesive layer.

Figure 4B:
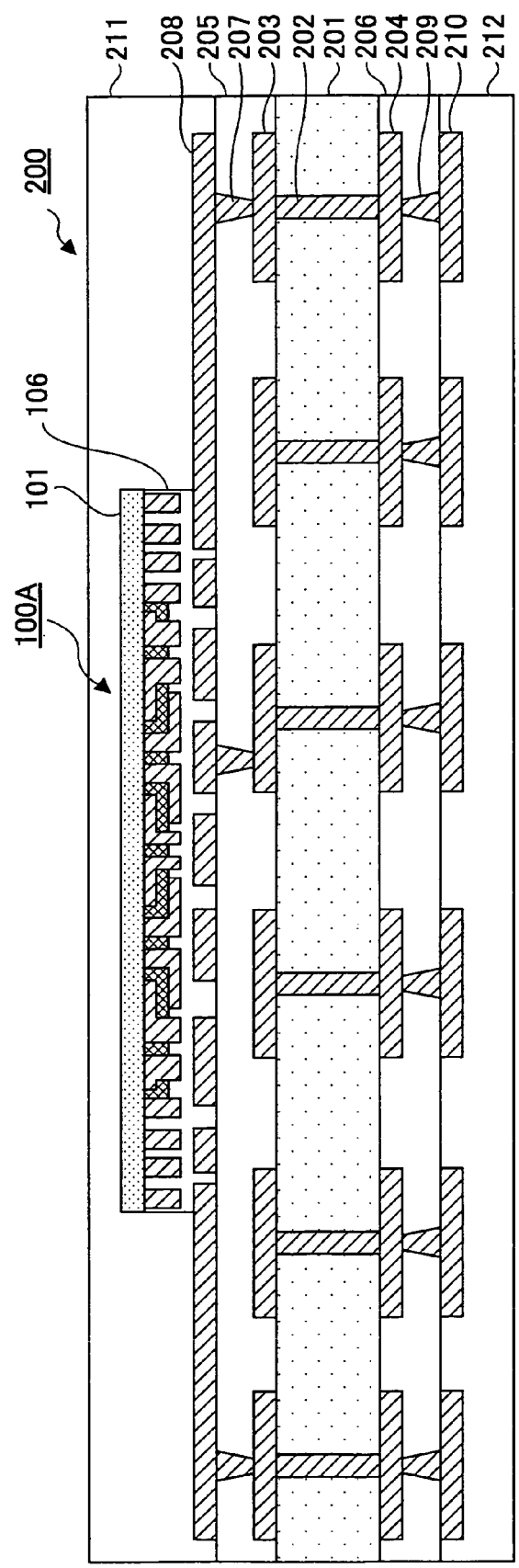
FIG. 4B is a second diagram illustrating the method of manufacturing the wiring board according to the embodiment 1.

Next, in the process as illustrated in FIG. 4B, an insulating layer 211 consisting of resin material such as, for example, epoxy, is formed by applying or laminating such that it covers the capacitor 100A, and the insulating layer 212 is similarly formed such that it covers the pattern wirings 210.

Figure 4C:
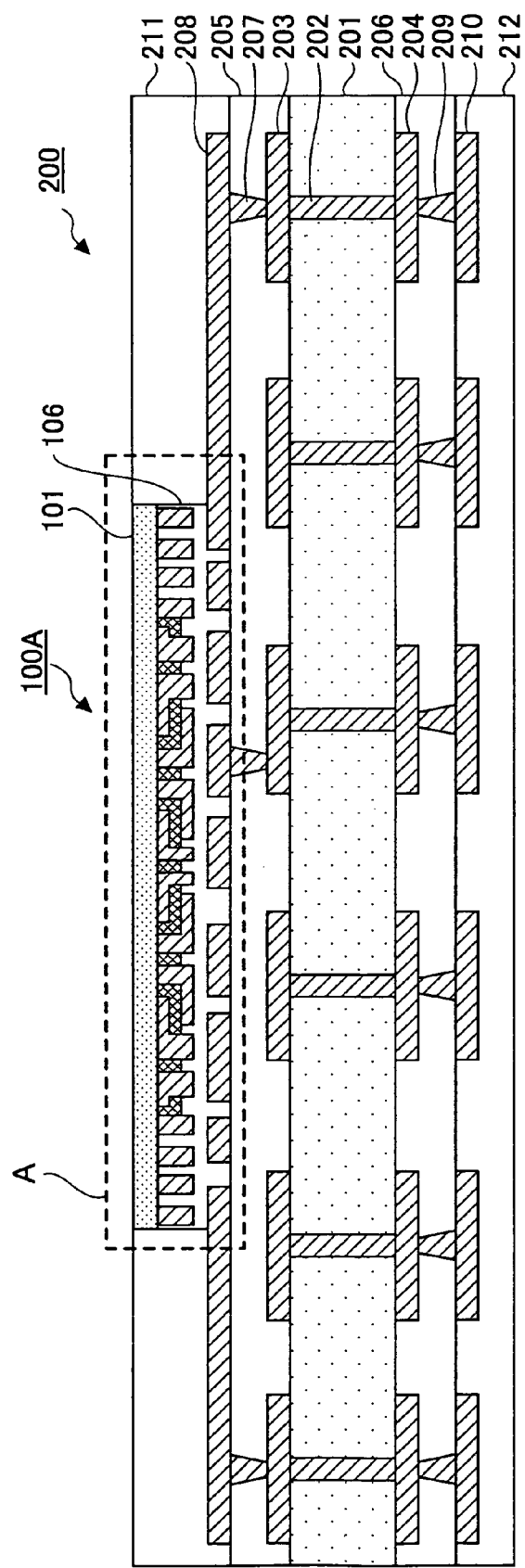
FIG. 4C is a third diagram illustrating the method of manufacturing the wiring board according to the embodiment 1.

Now, in the process as illustrated in FIG. 4C, the surface of the insulating layer 211 is scrubbed using a method such as, for example, buffing, such that the core substrate 101 is exposed. Similarly, the insulating layer 212 is scrubbed such that its thickness becomes appropriate for forming wiring at the insulating layer 212.

Next, the capacitor 100A and via wirings for connecting the multilayer wiring board are formed. It is noted that the subsequent process is described using FIGS. 5A through 5E in which a portion A of FIG. 4C is enlarged.

Figure 5A:
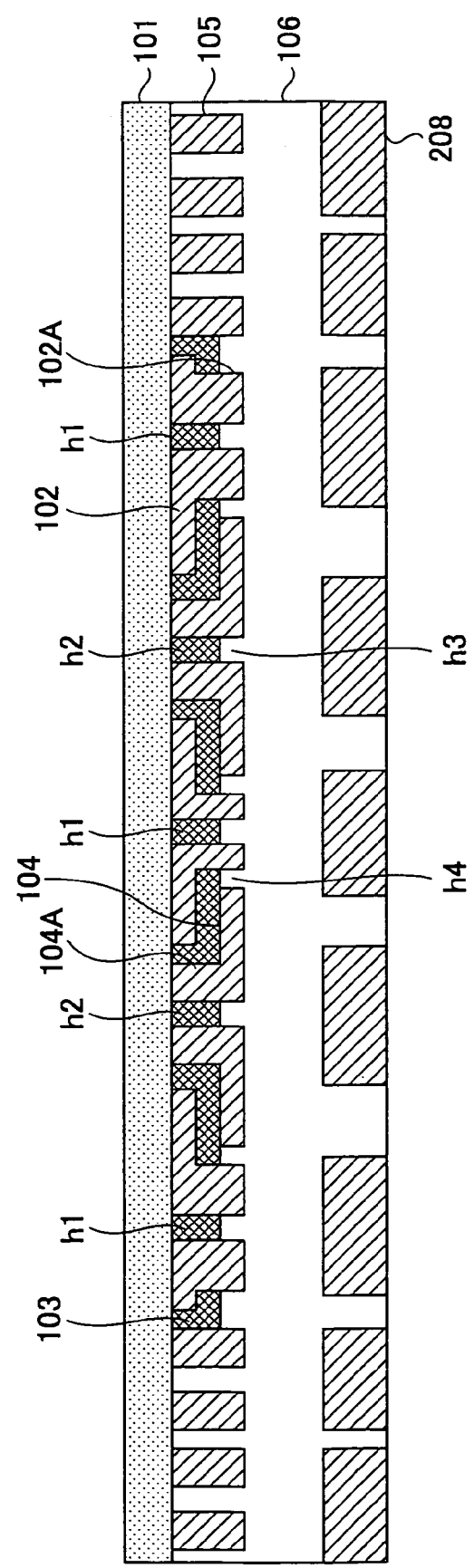
FIG. 5A is a fourth diagram illustrating the method of manufacturing the wiring board according to the embodiment 1.

First, FIG. 5A is an enlarged view of the portion A as illustrated in FIG. 4C. The capacitor 100A is installed such that it opposes the pattern wiring 208 with the insulating layer 106 in between.

Figure 5B:
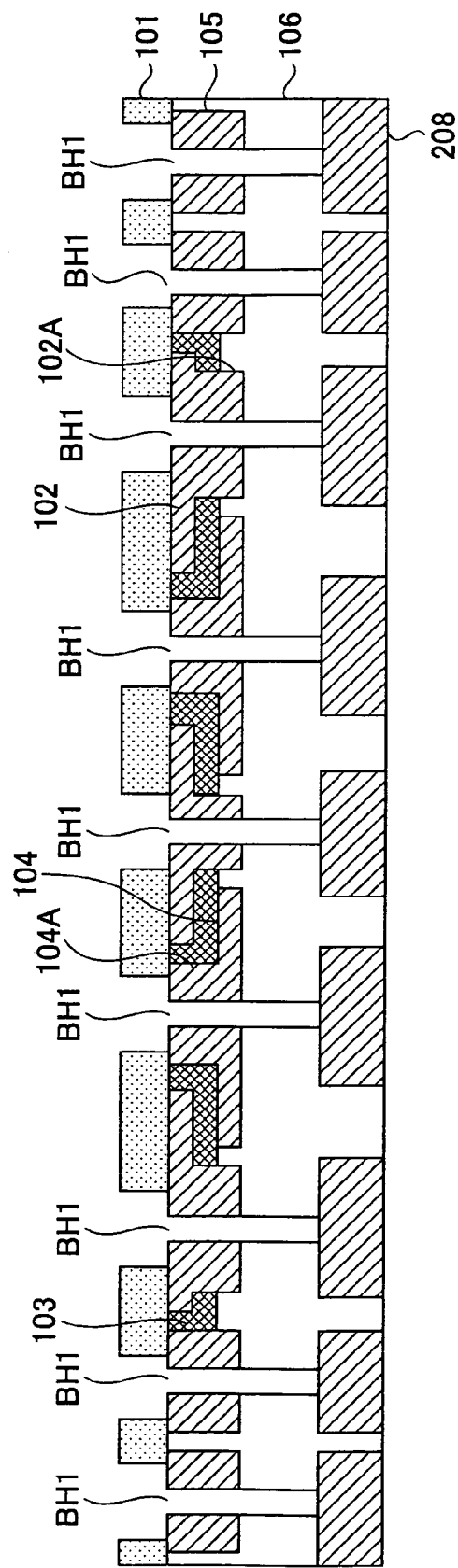
FIG. 5B is a fifth diagram illustrating the method of manufacturing the wiring board according to the embodiment 1.

Next, in the process as illustrated in FIG. 5B, via holes BH1 which reach the pattern wirings 208 are formed using via-hole forming means such as, for example, a laser, such that it pierces from the core substrate 101, the first electrode layer 102, a dielectric layer 103, a second electrode layer 104, and an insulating layer 106.

Here, the via holes BH1 are formed with either one of the electrode layer 102, the second electrode layer 104, and the mask pattern 105 as a mask, and it is preferable that the processing diameter of the laser be larger than a mask pattern formed on the mask, or in other words, a through hole, which makes the registration tolerance for forming the via wiring superior.

In other words, for the present embodiment, the diameter d1 of the through hole h1 of the first electrode layer 102, the diameter d3 of the through hole h3 of the second electrode layer 104, and the diameter of a through hole formed in the mask pattern 105 are smaller than the processing diameter of the laser.

Thus, the diameter of the via holes BH1 formed in the core substrate 101 becomes generally the same, whereas the diameter of the via holes BH1 formed in the insulating layer 106 between the capacitor and the pattern wiring 208 becomes smaller than the processing diameter of the laser. Here, the diameter of the via holes BH1 formed in the insulating layer 106 becomes generally the same as the diameter d1, the diameter d3, or the diameter of the through holes of the mask pattern 105.

In this way, having as a mask pattern an electrode layer with through holes which are smaller than the laser processing diameter provides an advantage in that the registration tolerance of via wirings formed in the via holes BH1 of the insulating layer 106 becomes superior. In other words, there is a difference between the size of the processing diameter of the laser and the size of the through holes of the mask so that the range allowable for the laser registration tolerance becomes larger. Thus, it is possible to make the tolerance for being connected to the pattern wiring 208 superior when forming via wirings in the via holes BH1, and to make the reliability of the connection superior. Moreover, it is possible to make the reliability of the electrical connection between the via hole wiring, and the first electrode layer or the second electrode layer superior.

When the core substrate 101 is being formed with an insulator such as, for example, glass, or resin material, the via wirings are formed with, for example, copper plating, etc., such that they fill in the via holes BH1.

For example, when the core substrate 101 is being formed with a non-insulator material, for example, silicon, the via wirings formed in the subsequent process and the inner wall of the via holes BH1 of the core substrate need to be insulated so that, for example, the process below is followed.

Figure 5C:
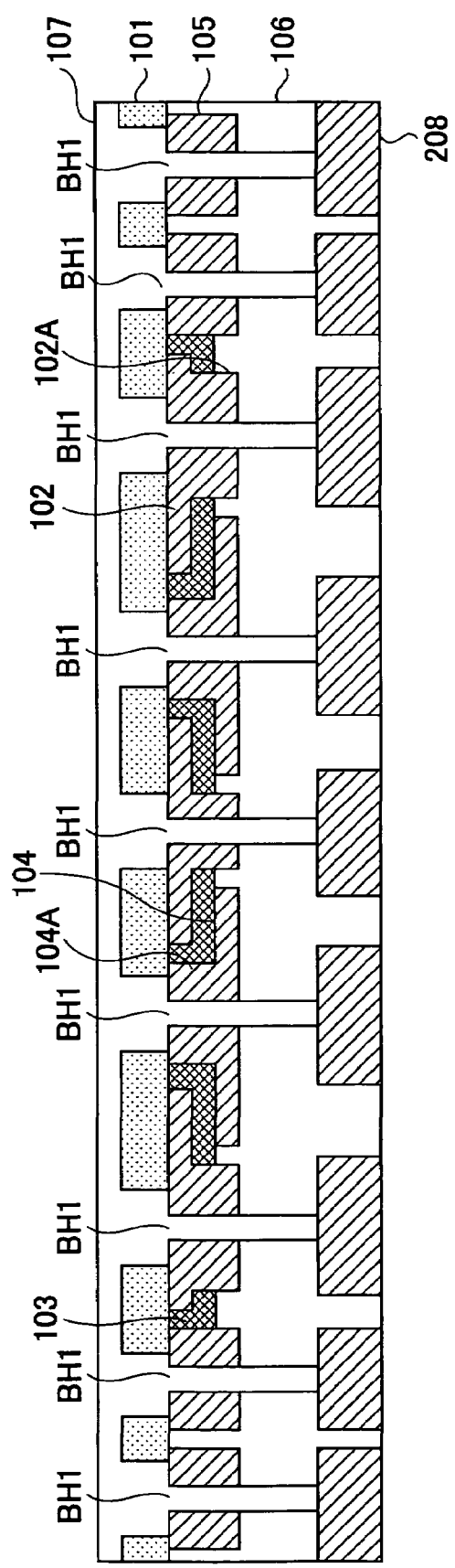
FIG. 5C is a sixth diagram illustrating the method of manufacturing the wiring board according to the embodiment 1.

First, in the process as illustrated in FIG. 5C, an insulating layer 107 consisting of, for example, epoxy resin, is formed such that the via holes BH1 are embedded therein and such that it covers the core substrate 101.

Figure 5D:
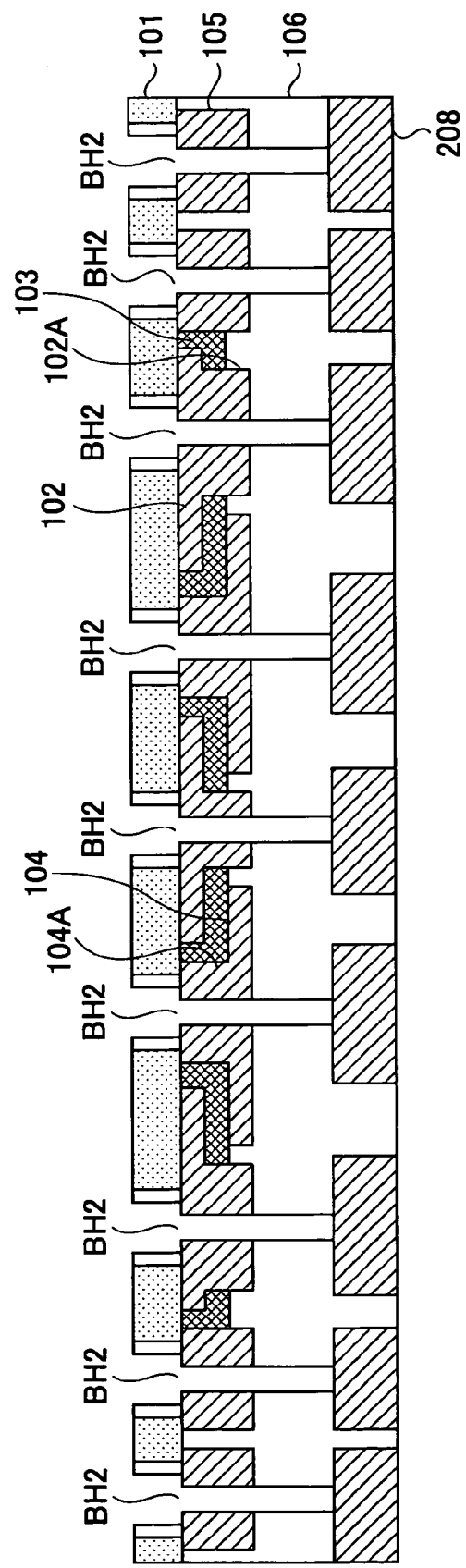
FIG. 5D is a seventh diagram illustrating the method of manufacturing the wiring board according to the embodiment 1.

Next, in the process as illustrated in FIG. 5D, via holes BH2 are formed in the same manner as the process as illustrated in FIG. 5B. Moreover, in the present process, as in the process as illustrated in FIG. 5B, it is preferable that the diameter d1 of the through holes h1 of the first electrode layer 102, the diameter d3 of the through holes h3 of the second electrode layer 104, and the diameter of through holes formed in the mask pattern 105 are formed such that they are smaller than the laser processing diameter of the present process, thereby making the reliability of the connection of the via hole wiring superior.

Moreover, it is preferable that the laser processing diameter of the present process be smaller than the laser processing diameter in the process as illustrated in FIG. 5B. Here, the laser processing diameter of the present process becomes smaller than the diameter of the via holes BH1 of the core substrate formed in the process as illustrated in FIG. 5B so that the insulating layer 107 insulates in between the via wirings formed in the subsequent process and the core substrate 101, thereby making it possible to insulate the via wirings and the core substrate and making the structure preferable.

Moreover, in the present process, the insulating layer 107 is scrubbed as needed such that the core substrate 101 is exposed.

Figure 5E:
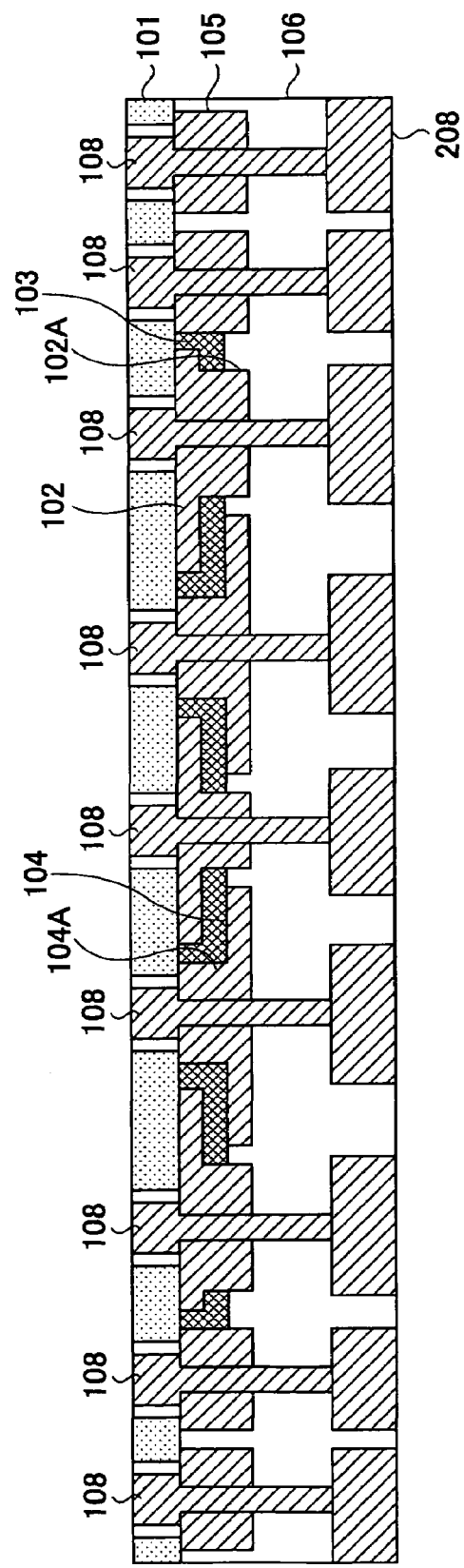
FIG. 5E is an eighth diagram illustrating the method of manufacturing the wiring board according to the embodiment 1.

Next, in the process as illustrated in FIG. 5E, the via wirings 108 are formed with, for example, copper plating such that they fill in the via holes BH2. Here, the via wirings connected to the power supply line or the ground line of the semiconductor chip are formed such that they are electrically connected to either one of the first electrode layer 102 and the second electrode layer 104.

For example, the via wirings formed such that they pierce the through holes h4 are formed such that they are connected on the side of the through holes h1, in other words the via wirings are formed such that they are electrically connected to the first electrode 102. On the other hand, the via wirings which are formed such that they pierce the through holes h2 and the through holes h3 are connected on the side of the through holes h3, in other words the via wirings are formed such that they are electrically connected to the second electrode 104.

Moreover, for the present embodiment, the via contact portions 102A are formed at the first electrode layer 102 and the via contact portions 104A are formed at the second electrode layer 104 so that the contact area of the via wirings and the electrode layers increases, making it possible to reduce the impedance of the connection of the via wirings and the electrode layers.

Furthermore, with the via contact portions 102A and 104A being formed, the dielectric layer 103 is never exposed when forming the via holes. Non-electrolytic plating on the dielectric layer 103 for forming a seed layer for electrolytic plating is difficult. Thus, in order to form the seed layer, a need arises to use such costly techniques as CVD and sputtering rather than non-electrolytic plating which is inexpensive. For the present embodiment, the via contact portion can be used as an electrode for electrolytic plating so that the via wirings 108 can be easily formed with electrolytic plating.

In addition, the through holes h1 of the first electrode layer 102 or the through holes h3 of the second electrode layer 104 are not limited to the case in which they are formed such that they oppose the through holes of the opposing electrode so that, for example, they may be formed at the edge of the electrode layers as illustrated.

In the process subsequent to FIG. 5E, the wiring structure and the connecting structure that are connected to the via wirings 108 are formed, and the wiring structure and the connecting structure are formed to be connectable with a semiconductor chip. Moreover, a number of layers of the wiring structure are formed also on the second side as illustrated in FIG. 4C, or in other words on the side on which the insulating layer 212 is formed, the number of layers depending on what is needed, so that the wiring board is completed.

Figure 6:
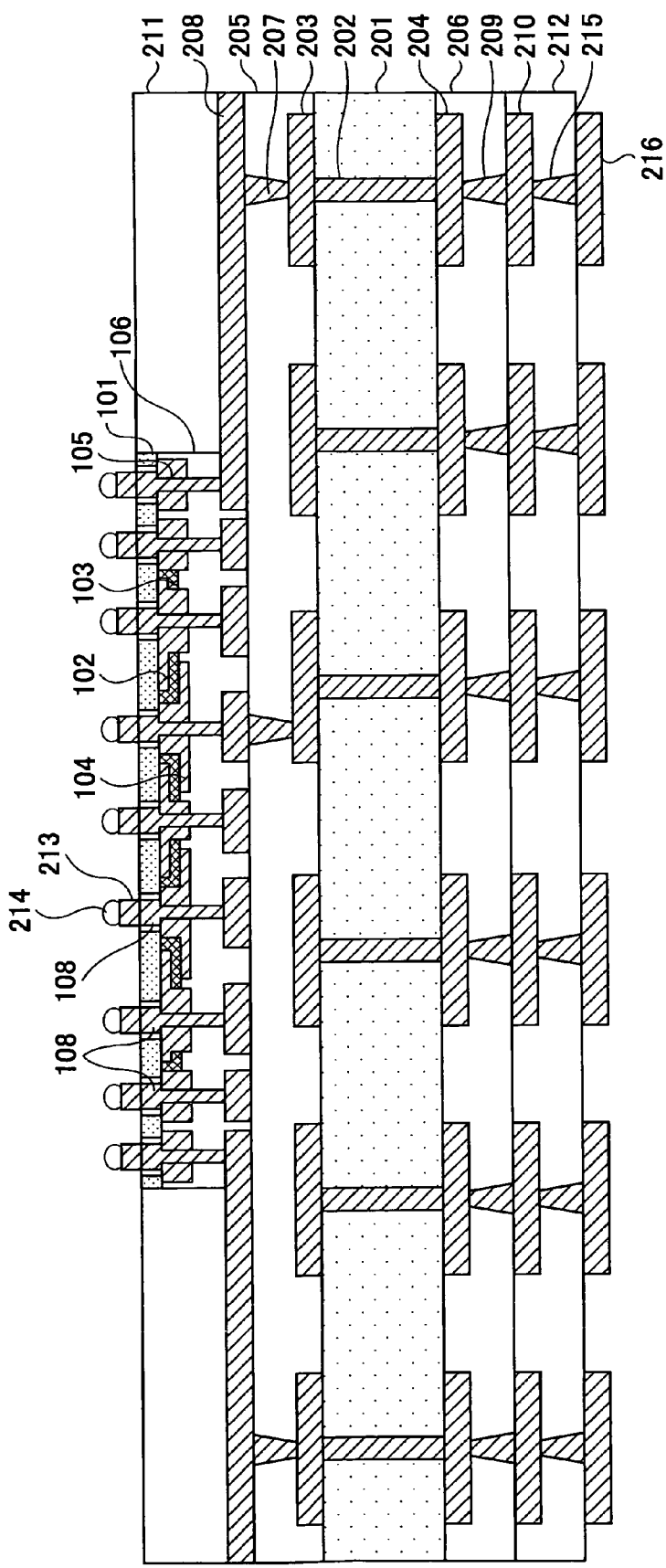
FIG. 6 is a diagram illustrating a first example of the wiring board which is formed by the method of manufacturing according to the embodiment 1.

FIG. 6 is a cross-sectional view schematically illustrating one example of a wiring board formed using the manufacturing method as described above.

Referring to FIG. 6, with the wiring board 300 as illustrated, after the process as illustrated in FIG. 5E, wiring posts 213 for connecting a semiconductor chip are formed on the via wirings 108, while soldering bumps 214, for example, are formed on the wiring posts 213. Electrode pads of a semiconductor chip, for example, are set to be connectable to the soldering bumps 214.

Moreover, on a first side of the insulating layer 212, via wirings 215 connected to the pattern wirings 210 are formed, while on a second side of the insulating layer 212, wiring patterns 216 connected to the via wirings 215 are formed.

In this way, the wiring structure can be stacked on the first side or the second side as needed so that it is formed thereon, and the multilayer wiring structure of the wiring board can be formed differently depending on the specification of a motherboard or a device to which the wiring board is connected so that it can be varied as illustrated, for example, in FIGS. 7 and 8 described next below.

Figure 7:
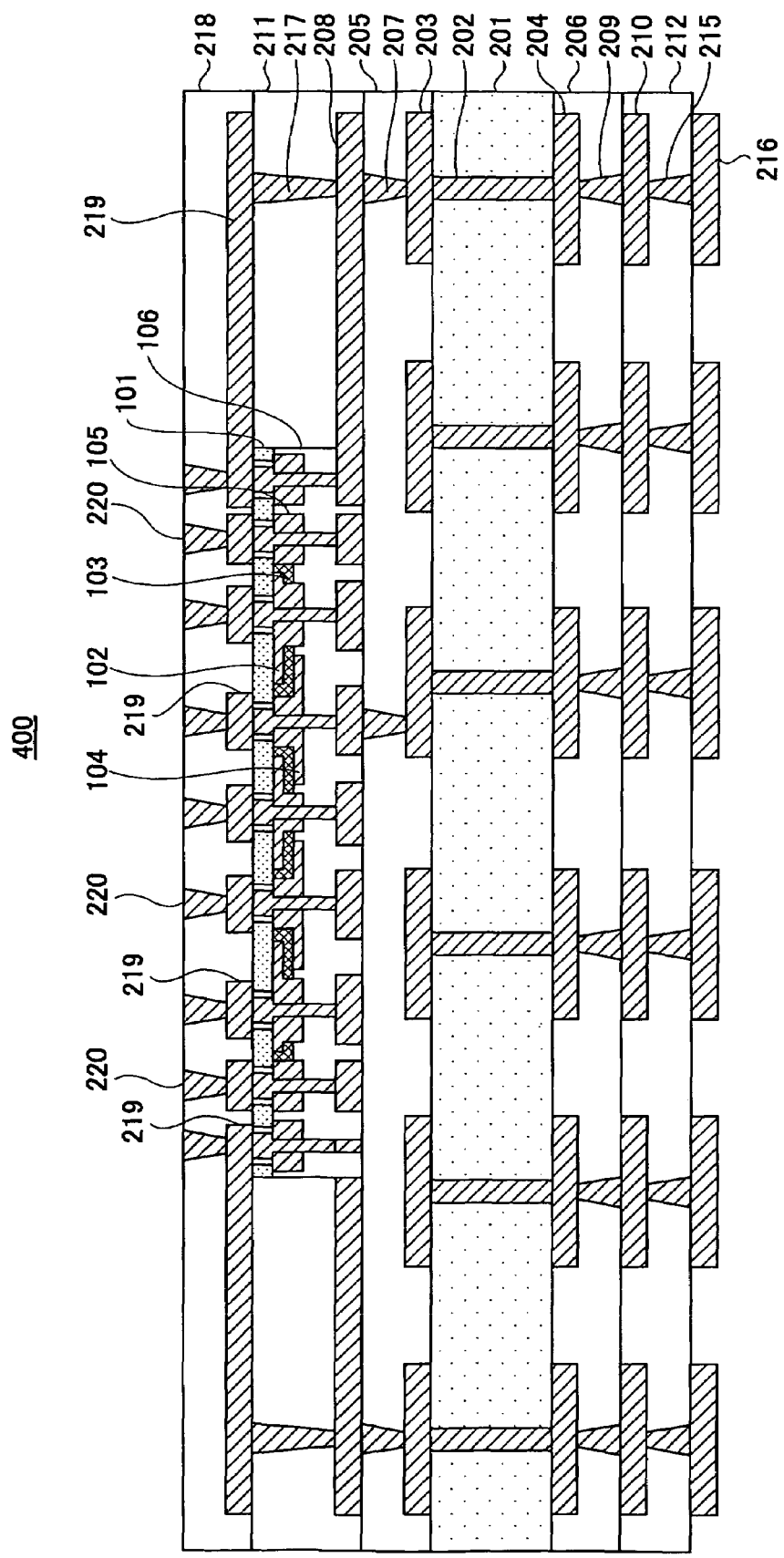
FIG. 7 is a diagram illustrating a second example of the wiring board which is formed by the method of manufacturing according to the embodiment 1.

For example, FIG. 7 illustrates a wiring board 400 which is a variation of the wiring board 300. In the illustrated wiring board, on the core substrate 101 or on the insulating layer 211 are formed pattern wirings 219, and via wirings 220 connected to the pattern wirings 219 that are surrounded by an insulating layer 218. Moreover, as needed, the pattern wirings 219 may be formed such that they are connected to the via wirings 108, and such that they are connected to the pattern wirings 208 through via wirings 217, for example.

Furthermore, FIG. 8 illustrates a wiring board 500 which is another variation of the wiring board 300. In the illustrated wiring board, via wirings 223 which are surrounded by the insulating layer 221 are formed. The via wirings 223 are connected to the pattern wirings 224 formed on the insulating layer 221. Moreover, the pattern wirings 224, for example, may be formed such that they are connected to the pattern wirings 208 through the via wirings 222.

In this way, a wiring board according to the present invention can be formed with different variations of the wiring structure depending on what is needed. Moreover, the wiring board of the present invention is not limited to a case of using a core substrate so that, for example, a form which omits the core substrate 201 may be adopted. In other words, an insulating layer which corresponds to the core substrate may be formed using a so-called build-up process. Moreover, the thickness of the insulating layer or the pattern wiring may be changed arbitrarily.

Embodiment 2

Moreover, when the core substrate 101 is formed with a non-insulator material (for example, silicon, etc.), a wiring board may be formed using a method as shown below. Even in this case, the same advantage as is shown for the embodiment 1 is provided.

For the present embodiment, the structure of the capacitor 100A is the same as is illustrated in FIG. 2.

For the present embodiment, the wiring board is formed following such processes as shown in FIGS. 9A through 9F below after forming the capacitor 100A.

Figure 9A:
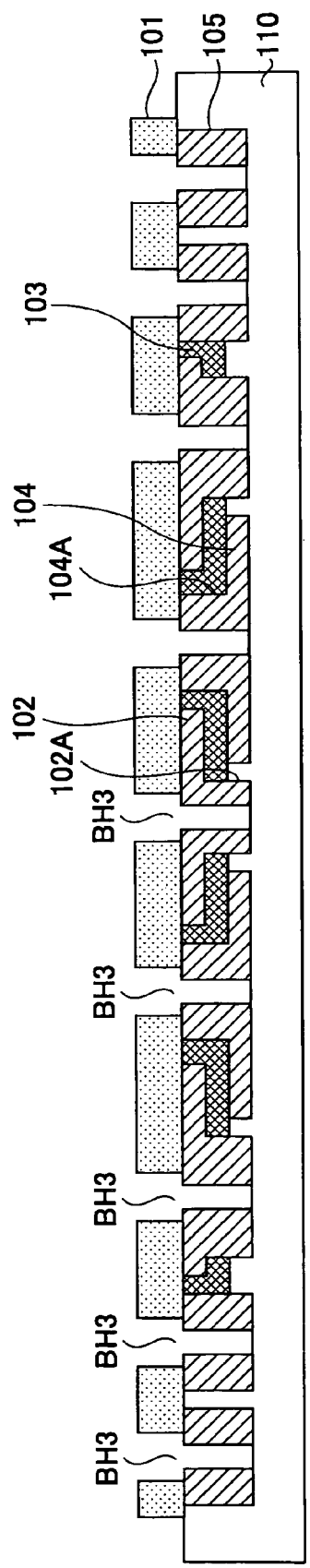
FIG. 9A is a first diagram illustrating a method of manufacturing a wiring board according to an embodiment 2.

First, in the process as illustrated in FIG. 9A, an insulating layer 110 consisting of a resin material such as epoxy is formed on the capacitor 100A as illustrated in FIG. 2 by laminating or applying, and via holes BH3 which pierce the core substrate 101 so as to reach the insulating layer 110 are formed with a laser from the side of the core substrate 101. Here, it is preferable that the laser processing diameter be larger than the diameter d1 of the through holes h1 of the first electrode 102, the diameter d3 of the through holes h3 of the second electrode 104, and the diameter of through holes formed in the mask pattern 105. This is due to the fact that the via holes formed in the core substrate 101 become larger than the via wirings to be formed in the subsequent process, making it easy to insulate between the core substrate and the via wirings.

Figure 9B:
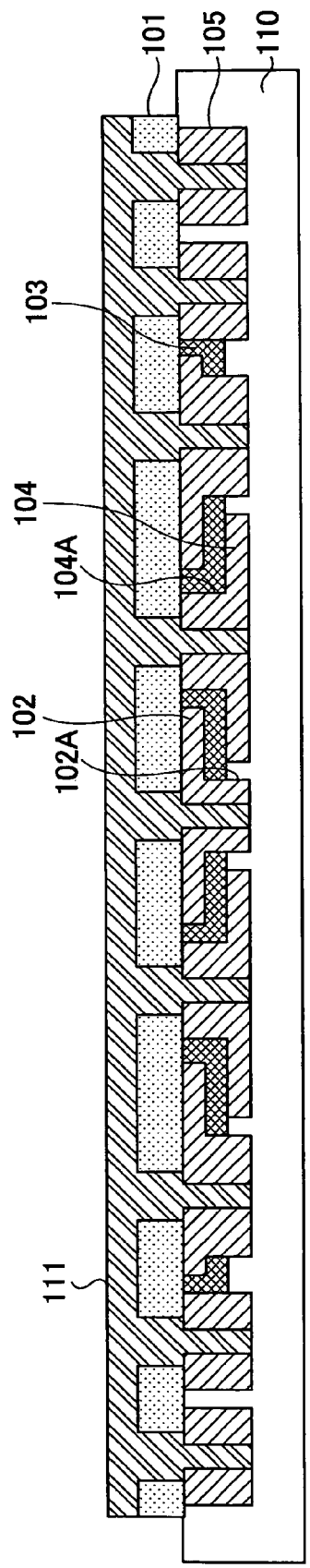
FIG. 9B is a second diagram illustrating a method of manufacturing the wiring board according to the embodiment 2.

Next, in the process as illustrated in FIG. 9B, an insulating layer 111 is formed on the core substrate 101 such that it fills in the via holes BH3.

Figure 9C:
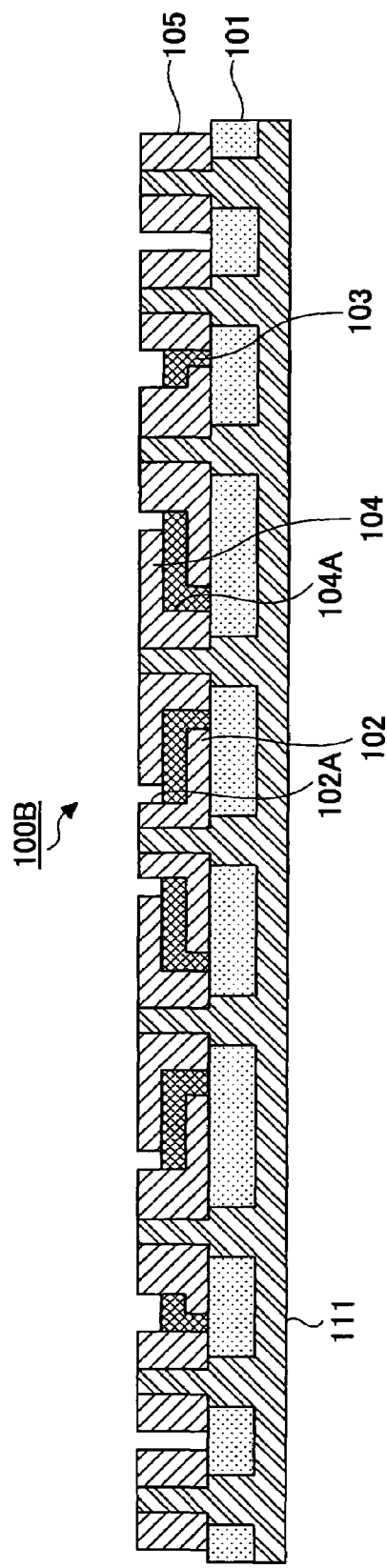
FIG. 9C is a third diagram illustrating a method of manufacturing the wiring board according to the embodiment 2.

Then, in the process as illustrated in FIG. 9C, the insulating layer 110 is stripped from the capacitor so as to form a capacitor structure 100B. Next, in a manner similar to the processes illustrated in FIG. 4A through FIG. 4C, the capacitor structure 100B is installed in the multilayer wiring structure 200 so as to form an insulating layer. For the present embodiment, it suffices to change the process illustrated in FIG. 5A through FIG. 5E in the embodiment 1 to the process illustrated in FIG. 9B through FIG. 9F.

Figure 9D:
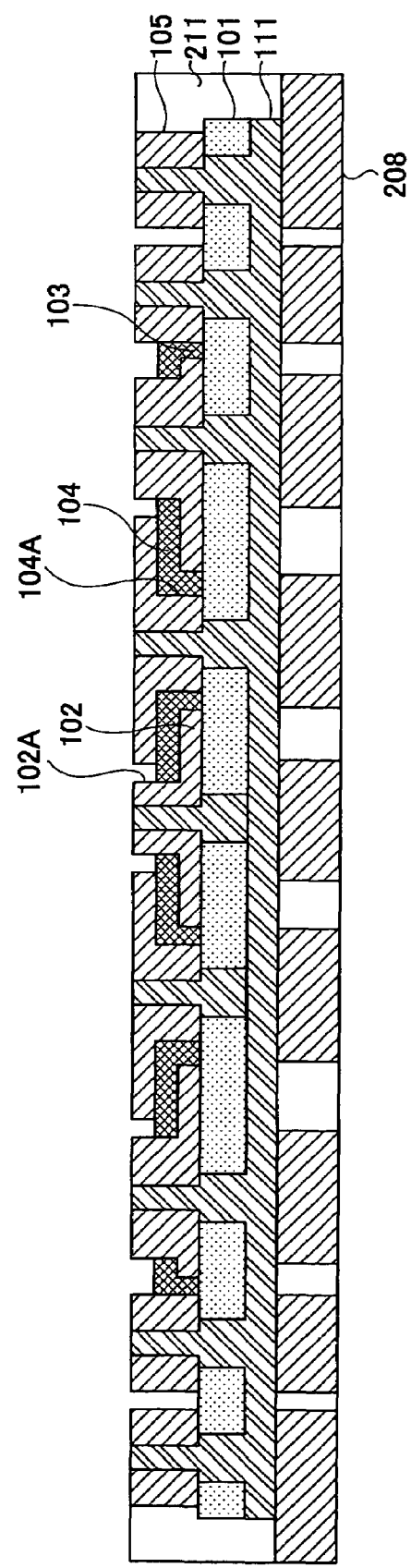
FIG. 9D is a fourth diagram illustrating a method of manufacturing the wiring board according to the embodiment 2.

FIG. 9D is an enlarged view in the vicinity of the capacitor structure 100B after its having been installed in the multilayer wiring structure 200 and having undergone the processes which are similar to the processes illustrated in FIG. 4A through FIG. 4C.

Next, in the process as illustrated in FIG. 9E, using via-hole forming means such as, for example, a laser, via holes BH4 are formed that pierce through holes formed in the first electrode layer 102, the dielectric layer 103, and the second electrode layer 104 and that reach the pattern wirings 208 from the insulating layer 111.

Here, the via holes BH4 are formed with either one of the first electrode layer 102, the second electrode 104, and the mask pattern 105. Moreover, the through holes h1 of the first electrode layer 102, the through holes h3 of the electrode layer 104, and the through holes formed in the mask pattern 105 are formed such that the diameter d1 of the through holes h1, the diameter d3 of the through holes h3, and the diameter of the through holes formed in the mask pattern 105 are smaller than the laser processing diameter.

In this way, setting as a mask pattern an electrode layer having through holes which are smaller than the laser processing diameter provides an advantage in that the registration tolerance of via wirings formed in the via holes BH4 of the insulating layer 111 becomes superior.

Next, in the process as illustrated in FIG. 9F, via wirings 112 are formed with, for example, copper plating, such that they fill in the via holes BH4. Here, the via wirings connected to the power supply line or the ground line of the semiconductor chip are formed such that they are electrically connected to either one of the first electrode layer 102 and the second electrode layer 104.

For example, a via wiring formed such that it pierces a through hole h1 and a through hole h4 is connected on the side of the through hole h1, or in other words, such that it is electrically connected to the first electrode layer 102. On the other hand, a via wiring formed such that it pierces a through hole h2 and a through hole h3 is connected on the side of the through hole h3, or in other words, such that it is electrically connected to the second electrode layer 104.

Moreover, in this case, the insulating layer 111 is formed between the via wirings 112 and the core substrate 101 so as to provide an insulation between the core substrate and the via wirings.

Furthermore, the method of further forming the wiring structure and the connection structure so as to form the wiring substrate is similar to what is described in the embodiment 1.

While preferred embodiments of the present invention are described above, the present invention is not limited to specific embodiments so that different variations and changes are possible within what is claimed.

The present application is based on Japanese Priority Patent Application No. 2004-380555 filed Dec. 28, 2004, with the Japanese Patent Office, the entire contents of which are hereby incorporated by reference.

What is claimed is:

1. A method of manufacturing a wiring board having a capacitor with a plurality of electrode layers, which layers oppose each other with a dielectric layer in between, one or more via wirings which pierce the electrode layers and a plurality of pattern wirings, which pattern wirings are connected to the corresponding via wirings, the method comprising the steps of:
    forming the electrode layers
    forming a through hole in the electrode layers such that, each layer has one or more through holes which the via wirings pierce, and the dielectric layer, and forming the capacitor;
    installing the capacitor such that the capacitor opposes the pattern wirings with an insulating layer in between;
    forming one or more via holes which reach the pattern wirings from the through holes; and
    forming the via wirings in the via holes;
    wherein the step of forming the via holes includes forming the via holes in the insulating layer with the electrode layers as a mask; and
    wherein the via holes are formed with a laser; and
    wherein the electrode layers consist of a first electrode layer and a second electrode layer, the formation steps of which are comprised of:
    forming in the first electrode layer a first of the through holes whose diameter is smaller than a processing diameter of the laser and a second of the through holes whose diameter is larger than the processing diameter; and
    forming in the second electrode layer a third of the through holes whose diameter is smaller than the processing diameter and a fourth of the through holes whose diameter is larger than the processing diameter;
    wherein the first through hole opposes the fourth through hole, and the second through hole opposes the third through hole.

2. The method of manufacturing the wiring board as claimed in claim 1, wherein plural of the via wirings are formed, and a first of the via wirings is electrically connected at the first through hole with the first electrode layer, and a second of the via wirings is electrically connected at the third through hole with the second electrode layer.

3. The method of manufacturing the wiring board as claimed in claim 2, further comprising the step of:
    forming at said first electrode layer a generally-cylindrical via-contact portion inside which said first via wiring is formed.

4. The method of manufacturing the wiring board as claimed in claim 2, further comprising the step of:
    forming at said second electrode layer a generally-cylindrical via-contact portion inside which said second via wiring is formed.

5. The method of manufacturing the wiring board as claimed in claim 1, wherein the capacitor is formed on a core substrate and the via hole is formed such that the via hole pierces the core substrate.

6. The method of manufacturing the wiring board as claimed in claim 1, wherein the capacitor is formed on the core substrate, the via hole is formed such that the via hole penetrates the core substrate, and the via hole formed in said core substrate is larger than the first through hole and the third through hole.

7. The method of manufacturing the wiring board as claimed in claim 5, wherein an insulator is formed between the core substrate and the via wiring.

8. The method of manufacturing the wiring board as claimed in claim 6, wherein an insulator is formed between the core substrate and the via wiring.

9. The method of manufacturing the wiring board as claimed in claim 5, wherein the core substrate consists of silicon.

10. The method of manufacturing the wiring board as claimed in claim 6, wherein the core substrate consists of silicon.

* * * * *